United States Patent
Mair et al.

(10) Patent No.: US 6,903,780 B2
(45) Date of Patent: Jun. 7, 2005

(54) METHOD OF EXPANDING HIGH-SPEED SERIAL VIDEO DATA PROVIDING COMPATIBILITY WITH A CLASS OF DVI RECEIVERS

(75) Inventors: Hugh Mair, Fairview, TX (US); Gordon Gammie, Plano, TX (US); Steve Clynes, Allen, TX (US); Rolf Lagerquist, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 655 days.

(21) Appl. No.: 09/966,167

(22) Filed: Sep. 28, 2001

(65) Prior Publication Data

US 2002/0186321 A1 Dec. 12, 2002

Related U.S. Application Data

(60) Provisional application No. 60/313,194, filed on Aug. 17, 2001, and provisional application No. 60/296,924, filed on Jun. 8, 2001.

(51) Int. Cl.$^7$ ................................................. H04N 7/04
(52) U.S. Cl. ....................... 348/469; 348/390.1; 341/50
(58) Field of Search ............................. 348/469, 240.2, 348/241, 390.1; 341/50, 51, 58, 102; 709/231; H04N 7/04

(56) References Cited

U.S. PATENT DOCUMENTS

| | | | |
|---|---|---|---|
| 4,453,158 A | * 6/1984 | Bluethgen .................... 341/143 |
| 6,281,815 B1 | * 8/2001 | Shim et al. .................... 341/59 |
| 6,486,804 B2 | * 11/2002 | Coene ........................... 341/50 |
| 6,490,627 B1 | * 12/2002 | Kalra et al. .................. 709/231 |
| 6,538,585 B2 | * 3/2003 | Liu ............................... 341/59 |

* cited by examiner

Primary Examiner—Michael H. Lee
Assistant Examiner—Trang U. Tran
(74) Attorney, Agent, or Firm—William B. Kempler; W. James Brady, III; Frederick J. Telecky, Jr.

(57) ABSTRACT

A method of expanding data to a high-speed serial video link in such a way that it is invisible to existing receivers and such that auxiliary data, i.e. audio data, can be transmitted without any knowledge of the capabilities of the display to receive the auxiliary data.

14 Claims, 1 Drawing Sheet

$$S0 = D0 \wedge DC$$
$$S1 = D1 \wedge S0 \wedge TC \wedge DC$$
$$S2 = D2 \wedge S1 \wedge TC \wedge DC$$
$$S3 = D3 \wedge S2 \wedge TC \wedge DC$$
$$S4 = D4 \wedge S3 \wedge TC \wedge DC$$
$$S5 = D5 \wedge S4 \wedge TC \wedge DC$$
$$S6 = D6 \wedge S5 \wedge TC \wedge DC$$
$$S7 = D7 \wedge S6 \wedge TC \wedge DC$$
$$S8 = TC \wedge 1$$
$$S9 = DC$$

S0 = D0~INV
S1 = D1~S0~INV
S2 = D2~S1~INV
S3 = D3~S2~INV
S4 = D4~S3~INV
S5 = D5~S4~INV
S6 = D6~S5~INV
S7 = D7~S6~INV
S8 = 1
S9 = INV

FIG. 3

S0 = D0~DC
S1 = D1~S0~AUX~DC
S2 = D2~S1~AUX~DC
S3 = D3~S2~AUX~DC
S4 = D4~S3~AUX~DC
S5 = D5~S4~AUX~DC
S6 = D6~S5~AUX~DC
S7 = D7~S6~AUX~DC
S8 = AUX~1
S9 = DC

FIG. 4

S0 = D0~INV
S1 = D1~S0~INV
S2 = D2~S1~INV
S3 = D3~S2~INV
S4 = D4~S3~INV
S5 = D5~S4~INV
S6 = D6~S5~INV
S7 = D7~S6~INV
S8 = AUX
S9 = INV

METHOD OF EXPANDING HIGH-SPEED SERIAL VIDEO DATA PROVIDING COMPATIBILITY WITH A CLASS OF DVI RECEIVERS

RELATED PATENT APPLICATIONS

This application is related to U.S. Patent Application Ser. No. 60/296,924, entitled Method For Adding Additional Data To A Communication Link While Retaining Backward Compatibility filed on Jun. 8, 2000 and U.S. Patent Application 60/313,194 entitled New Encoding Algorithm Providing Compatibility With a Class of DVI Receivers, filed on Aug. 17, 2001.

BACKGROUND OF THE INVENTION

1. Field of the Invention

This invention relates generally to data encoding, and more particularly to data encoding techniques that expand data to a high-speed serial video link in such a way that it is invisible to existing receivers such that auxiliary data, i.e. an audio data stream, can be transmitted without any knowledge of the capabilities of the video display to receive auxiliary data.

2. Description of the Prior Art

The Digital Visual Interface Specification, Revision 1.0 (DVI 1.0), published by the Digital Display Working Group (DDWG) describes an encoding scheme that should be used for transmission of video data across an interconnecting cable in a compliant system. The DVI 1.0 encoding algorithm involves the expansion of 8-bit video data to a 10-bit serial word. During active video times, the video data is encoding, and during inactive video times, two binary signals are encoded. On one channel, for example, these two binary signals are used to represent horizontal and vertical synchronizing signals. For active video, the input word is denoted as D0 through D7 (D0 is the LSB). The serial word is denoted S0 through S9 (where S0 is the LSB and the first bit to be sent). The algorithm is shown in FIG. 1 where '^' is defined as an exclusive-OR operation, TC is a 'Transition Control' bit, and DC is a 'DC Balance Control' bit, as described in further detail herein below.

In order to be able to identify active video data from non-active video data, the inventors of the prior art algorithm set forth above identified the number of transitions within the 10-bit word as a key characteristic that could be detected. Furthermore, certain characters could be sent to uniquely identify the LSB/MSB positions within the serial data stream. In order to prevent the active video characters from being misinterpreted, the TC bit is used to reduce the number of transitions within an active data symbol.

EXAMPLE

Assume DC=0 (DC has a separate, independent function described herein below), with TC=0, a binary data symbol (LSB)11111111(MSB) would be first encoded as (LSB)1010101010(MSB). Since the goal of the algorithm is to minimize the number of transitions for active data, the TC bit must be set (i.e. perform transition control), and hence the character would be fully encoded as (LSB)1111111100(MSB).

Further, if one assumes that the preceding bit in the serial stream has a logic value of '1', it can be shown that all 8-bit input data can be encoded into a 10-bit code with fewer than six 0-to-1 or 1-to-0 transitions.

The DC Balance Control bit is used to optionally invert bits S0 through S7 in order to maintain a DC bias close to zero. The goal of the encoder is to transmit exactly the same number of ones and zeros over a period of time. The encoder keeps a running count of the number of ones and zeros that it has transmitted within the current active video period. If there is a disparity between the number of ones and the number of zeros that have been sent, the encoder will adjust the DC Balance Control bit to ensure that the current character, at worst, does not add to this disparity, and typically will cause the disparity to bias itself towards zero.

EXAMPLE

If the first active data symbol is (LSB)10000000(MSB), the encoder will transmit the serial code (LSB)1111111110 (MSB). This will accumulate a disparity of +8 (i.e. nine '1's and one '0' have been sent). If the second active data symbol is (LSB)01000000(MSB), the transmitter can send either (LSB)0111111110(MSB) or (LSB)10000000110(MSB). These two characters have individual disparities of +6 and −4 respectively. Since it is desirable to maintain a cumulative disparity close to zero, the second character must be sent; hence the cumulative disparity will become +4([+8]+ [−4]).

For the purpose of DVI 1.0, there are four synchronization characters that represent inactive video data. The particular value that should be sent depends on the state of the two additional binary signals that are transmitted during inactive video:

EXAMPLE:

(C1,C0)=(0,0): (LSB)0010101011(MSB)
(C1,C0)=(0,1): (LSB)1101010100(MSB)
(C1,C0)=(1,0): (LSB)0010101010(MSB)
(C1,C0)=(1,1): (LSB)1101010101(MSB)

As described above, each 8-bit word is expanded to 10 bits for transmission. One of the added bits is used for DC balancing, as stated herein before, to allow the signal to be AC coupled as in a fiber optics system. This is done by optionally inverting the 8-bit data to generate more 'ones' or 'zeros' as necessary. The DC balance bit then indicates to the receiver that this inversion took place.

In view of the foregoing, an encoding scheme that simplifies the TMDS encoding algorithm described in the DVI 1.0 specification while retaining compatibility with most existing DVI receivers would provide great advantages over the prior art. An encoding scheme that enhances the TMDS encoding algorithm described in the DVI 1.0 specification such that auxiliary data, i.e. an audio data stream, can be added to a high-speed serial video link in such a way that it is invisible to existing receivers and such that auxiliary data can be transmitted without any knowledge of the capabilities of the display to receive auxiliary data would also provide great advantages over the prior art.

SUMMARY OF THE INVENTION

The prior art DVI signaling method performs an 8B/10B encoding for the data being sent on the link. The two additional bits perform specific and distinct functions:

1) Bit 8 is used to indicate a translation that the data may go through for the purpose of transition minimization. If the number of transitions (0→1, or 1→0) is greater than 4, then the absence of a transition is encoded. In this way, the number of transitions in the transmitted word will always be less than or equal to 4.

2) Bit 9 is used to indicate the optional inversion of bits 0 through 7. This inversion is used to ensure that during the transmission of active video, the number of logic 1 and 0 bits sent remains approximately the same.

The present invention is directed to encoding schemes that simplify the TMDS encoding algorithm described in the DVI 1.0 specification while retaining compatibility with most existing DVI receivers. The encoding schemes expand data to a high-speed serial video link in such a way that it is invisible to existing receivers such that auxiliary data, i.e. audio data stream, can be transmitted without any knowledge of the capabilities of the video display to receive the auxiliary data.

In one aspect of the invention, a digital visual interface encoding scheme that expands data to a high-speed serial video link such that auxiliary data can be transmitted is implemented without using a Transition Control bit such that the number of transitions is not controlled and such that the active and non-active video cannot be separated based on the number of transitions while retaining compatibility with most existing DVI receivers.

In another aspect of the invention, a digital visual interface encoding scheme that expands data to a high-speed serial video link such that auxiliary data can be transmitted is implemented such that a DC balance is not maintained on the associated cable while retaining compatibility with most existing DVI receivers.

In yet another aspect of the invention, a digital visual interface encoding scheme that expands data to a high-speed serial video link such that auxiliary data can be transmitted is implemented by expanding of 8-bit video data to a 10-bit serial word such that bit-S8 of the 10-bit serial word is set to both binary levels randomly and independently from the active 8-bit video data to allow bit-S8 to be used for transmission of the auxiliary data, such as an audio data stream.

BRIEF DESCRIPTION OF THE DRAWINGS

Other aspects, features and advantages of the present invention will be readily appreciated as the invention becomes better understood by reference to the following detailed description when considered in connection with the accompanying drawings in which like reference numerals designate like parts throughout the figures thereof and wherein:

FIG. 1 illustrates the prior art (DVI 1.0) digital visual interface encoding algorithm;

FIG. 2 illustrates an encoding scheme that simplifies the TMDS encoding algorithm described in the DVI 1.0 specification and depicted in FIG. 1, discussed herein above, while retaining compatibility with most existing DVI receivers;

FIG. 3 illustrates a digital visual interface encoding scheme according to one embodiment of the present invention; and FIG. 4 illustrates a digital visual interface encoding scheme according to another embodiment of the present invention.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

The present embodiments are best understood by first setting forth a short synopsis of the prior art discussed herein before. The Digital Visual Interface Specification, Revision 1.0 (DVI 1.0), as stated herein before, describes an encoding scheme that should be used for transmission of video data across an interconnecting cable in a compliant system. The DVI 1.0 encoding algorithm involves the expansion of 8-bit video data to a 10-bit serial word. During active video times, the video data is encoding, and during inactive video times, two binary signals are encoded. On one channel, for example, these two binary signals are used to represent horizontal and vertical synchronizing signals.

For active video, the input word is denoted as D0 through D7 (D0 is the LSB). The serial word is denoted S0 through S9 (where S0 is the LSB and the first bit to be sent). The algorithm is illustrated in FIG. 1 as:

$S0 = D0 \wedge DC$ $S1 = D1 \wedge S0 \wedge TC \wedge DC$ $S2 = D2 \wedge S1 \wedge TC \wedge DC$ $S3 = D3 \wedge S2 \wedge TC \wedge DC$ $S4 = D4 \wedge S3 \wedge TC \wedge DC$ $S5 = D5 \wedge S4 \wedge TC \wedge DC$ $S6 = D6 \wedge S5 \wedge TC \wedge DC$ $S7 = D7 \wedge S6 \wedge TC \wedge DC$ $S8 = TC \wedge 1$ $S9 = DC$ where '$\wedge$' is defined as an exclusive-OR operation, TC is a 'Transition Control' bit, and DC is a 'DC Balance Control' bit, as described in further detail herein below.

In order to be able to identify active video data from non-active video data, the inventors of the prior art algorithm set forth above identified the number of transitions within the 10-bit word as a key characteristic that could be detected. Furthermore, certain characters could be sent to uniquely identify the LSB/MSB positions within the serial data stream. In order to prevent the active video characters from being misinterpreted, the TC bit is used to reduce the number of transitions within an active data symbol.

Further, if one assumes that the preceding bit in the serial stream has a logic value of '1', it can be shown that all 8-bit input data can be encoded into a 10-bit code with fewer than six 0-to-1 or 1-to-0 transitions.

The DC Balance Control bit is used to optionally invert bits S0 through S7 in order to maintain a DC bias close to zero. The goal of the encoder is to transmit exactly the same number of ones and zeros over a period of time. The encoder keeps a running count of the number of ones and zeros that it has transmitted within the current active video period. If there is a disparity between the number of ones and the number of zeros that have been sent, the encoder will adjust the DC Balance Control bit to ensure that the current character, at worst, does not add to this disparity, and typically will cause the disparity to bias itself towards zero.

EXAMPLE

If the first active data symbol is (LSB)10000000(MSB), the encoder will transmit the serial code (LSB)1111111110 (MSB). This will accumulate a disparity of +8 (i.e. nine '1's and one '0' have been sent). If the second active data symbol is (LSB)01000000(MSB), the transmitter can send either (LSB)0111111110(MSB) or (LSB)1000000011(MSB). These two characters have individual disparities of +6 and −4 respectively. Since it is desirable to maintain a cumulative disparity close to zero, the second character must be sent; hence the cumulative disparity will become +4 ([+8]+ [−4]).

For the purpose of DVI 1.0, there are four synchronization characters that represent inactive video data. The particular value that should be sent depends on the state of the two additional binary signals that are transmitted during inactive video:

EXAMPLE (C1,C0)=(0,0): (LSB)0010101011(MSB)
(C1,C0)=(0,1): (LSB)1101010100(MSB)
(C1,C0)=(1,0): (LSB)0010101010(MSB)
(C1,C0)=(1,1): (LSB)1101101001(MSB)

As described above, each 8-bit word is expanded to 10 bits for transmission. One of the added bits is used for DC balancing, as stated herein before, to allow the signal to be AC coupled as in a fiber optics system. This is done by optionally inverting the 8-bit data to generate more 'ones' or 'zeros' as necessary. The DC balance bit then indicates to the receiver that this inversion took place. In view of the foregoing, an encoding scheme that simplifies the TMDS encoding algorithm described in the DVI 1.0 specification while retaining compatibility with most existing DVI receivers would provide great advantages over the prior art. An encoding scheme that enhances the TMDS encoding algorithm described in the DVI 1.0 specification such that auxiliary data can be added to a high-speed serial video link in such a way that it is invisible to existing receivers and such that auxiliary data can be transmitted without any knowledge of the capabilities of the display to receive the auxiliary data would also provide great advantages over the prior art.

FIG. 2 illustrates an encoding scheme that simplifies the TMDS encoding algorithm described in the DVI 1.0 specification and depicted in FIG. 1, discussed herein above, while retaining compatibility with most existing DVI receivers according to the best mode known by the present inventors. This encoding scheme has been disclosed and claimed by the present inventors in co-pending U.S. Patent Application Ser. No. 09/953,803 entitled METHOD OF ENCODING VIDEO DATA FOR SERIAL TRANSMISSION, filed on Sep. 17, 2001, assigned to the assignee of the present invention and is incorporated by reference in its entirety herein. As seen in FIG. 2, the encoding algorithm can be described as:

S0=D0^INV
S1=D1^S0^INV
S2=D2^S1^INV
S3=D3^S2^INV
S4=D4^S3^INV
S5=D5^S4^INV
S6=D6^S5^INV
S7=D7^S6^INV
S8=1
S9=INV

It can also be seen that the generation of the TC (Transition Control) bit has been removed. The implication is that the number of transitions is not controlled; and hence the active and non-active video cannot be separated based on the number of transitions. Although the INV bit has a similar function to the DC bit in the DVI 1.0 standard, the algorithm for deriving it is very different. In the algorithm shown in FIG. 2, no attempt is made to maintain a DC balance on the cable. Instead, the INV bit is set to a '1' for the purpose of removing 'rogue' character sequences; it is set to a '0' at all other times. Rogue character sequences, as used herein, are defined in two ways as:

1) any character which generates a reserved synchronization character upon encoding, e.g, (LSB)00111111(MSB) will encode as (LSB)0010101010(MSB); since this is synchronization character (1,0), the INV bit must be set to avoid sending a decodable synchronization character during active video. The encoded stream therefore appears as (LSB) 1101010111(MSB) which is not a reserved character; or 2) a sequence of two adjacent synchronization characters appearing in any position across the span of three consecutive stream characters. The present inventors evaluated different DVI 1.0 receivers and found this criteria was used by most of the DVI 1.0 receivers that were evaluated to determine the LSB/MSB position. Two consecutive characters was determined to be significant since this causes an LSB/MSB realignment in the receiver and hence the second synchronization character is fully decoded. Generation of consecutive synchronization characters must therefore be avoided.

EXAMPLE (LSB)00000001(MSB), (LSB)11111110(MSB), (LSB) 11111100(MSB) would encode as serial stream: (LSB) 0000000110(MSB), (LSB)1010101110(MSB), (LSB) 1010100010(MSB). It can be seen that the synchronization characters 1101010101 and 1101010100 occur consecutively within the stream; hence this stream is illegal. The algorithm illustrated in FIG. 2 would implement the INV bit to generate the stream as: (LSB)0000000110(MSB), (LSB) 0101010011(MSB), (LSB)1010100010(MSB), which does not contain an illegal sequence.

The present inventors tested different brands of DVI 1.0 compliant receivers and found most of the brands correctly decoded the algorithm described herein above with reference to FIG. 2. In summary explanation of the above, the encoding scheme shown in FIG. 2 simplifies the TMDS encoding algorithm described in DVI 1.0, while retaining compatibility with most existing DVI receivers. The generation of the Transition Control bit has been removed; and although the INV bit has a similar function to the DC bit in the DVI 1.0 standard, the algorithm for deriving it is very different. No attempt is made to maintain a DC balance on the cable. Instead, the INV bit is set to a '1' for the purpose of removing 'rogue' character sequences; otherwise it is always set to a '0'.

Looking now at FIG. 3, a digital visual interface encoding scheme is illustrated according to one embodiment of the present invention and that is an extension of the encoding scheme discussed above with reference to FIG. 2. The present inventors have found that the S8-bit need not be set to '1' as set forth above in the method described with reference to FIG. 2. The inventors have in fact discovered that the S8-bit can be set to both binary levels randomly and independently from the active video data. In this way, the S8-bit can be effectively used for transmission of auxiliary data such as an audio data stream. The encoding scheme shown in FIG. 3 can be described as:

S0=D0^DC
S1=D1^S0^AUX^DC
S2=D2^S1^AUX^DC
S3=D3^S2^AUX^DC
S4=D4^S3^AUX^DC
S5=D5^S4^AUX^DC
S6=D6^S5^AUX^DC
S7=D7^S6^AUX^DC
S8=AUX^1
S9=DC where AUX is an auxiliary data bit that can change every word.

FIG. 4 illustrates a digital visual interface encoding scheme according to another embodiment of the present invention that can be defined as:

S0=D0^INV
S1=D1^S0^INV
S2=D2^S1^INV
S3=D3^S2^INV
S4=D4^S3^INV
S5=D5^S4^INV
S6=D6^S5^INV
S7=D7^S6^INV
S8=AUX
S9=INV where AUX is an auxiliary data bit that can change every word. The present inventors found that while both coding schemes worked, the method shown in FIG. 3 was found to provide compatibility with existing DVI 1.0 receivers, while the method shown in FIG. 4 was found to require a change to all DVI 1.0 receivers to allow for correct data recovery. It can be appreciated that the particular encoding method employed will then be at the discretion of the system integrator in conjunction with the silicon vendor.

Both methods of expanding video data, discussed above with reference to FIGS. 3 and 4, successfully generate a serial word suitable for transmission across a high-speed video link in a digital visual interface compliant system. The methods comprise the steps of:

encoding a plurality of active video data bits (D0–D7) to generate all of the bits (S0–S7) other than the two most significant bits (S8 and S9) of a serial word;

setting the next to the most significant bit (S8) of the serial word to a binary level randomly and independently of the active video data bits (D0–D7) wherein the next to the most significant bit (S8) is determined in response to an audio data stream; and setting the most significant bit (S9) of the serial word to a binary level determined by a control bit selected from the group consisting of a DC Balance Control bit and a rogue character sequence removal (INV) bit Looking again at FIG. 3, bits S0–S7 of a serial word (S0–S9), are expanded in association with a DC balancing bit 'DC'. Specifically, bit S0 is generated from bit D0 of the active video data and the DC Balance Control bit. Bit S1 of the serial word is then generated from bit D1 of the active video data, the generated bit S0, an auxiliary data bit discussed herein before, and the DC Balancing Control bit, also discussed herein before. This process is similarly repeated to generate bits S2–S7 of the serial word. Bit S9 of the serial word remains a DC Balancing Control bit, similar to the scheme discussed above with reference to FIG. 1. Bit S8, however, is generated from auxiliary data since the present inventors have found that this bit can be set to both binary levels randomly and independently from the active video data stream while still retaining compatibility with existing DVI 1.0 receivers.

Looking again at FIG. 4, bits S0–S7 of a serial word (S0–S9), are expanded in association with an inversion bit 'INV' discussed herein before in association with 'rogue' character sequences and particularly with reference to FIG. 2. Specifically, bit S0 is generated from bit D0 of the active video data and the INV bit. Bit S1 of the serial word is then generated from bit D1 of the active video data, the generated bit S0, and the INV bit. This process is similarly repeated to generate bits S2–S7 of the serial word. Bit S9 of the serial word is simply the INV bit, while bit S8 is generated from auxiliary data. The encoding scheme discussed above with reference to FIG. 4 was found by the present inventors to require a change to all DVI 1.0 receivers to allow for correct data recovery. The encoding scheme depicted in FIG. 3 was found therefore to be more preferable of the two schemes due to its compatibility with existing DVI 1.0 receivers.

This invention has been described in considerable detail in order to provide those skilled in the digital visual interface signaling art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A method of expanding video data to generate a serial word suitable for transmission across an interconnecting cable in a digital visual interface compliant system, the method comprising the steps of:

encoding a plurality of active video data bits to generate all of the bits other than the two most significant bits of a serial word;

setting the next to the most significant bit of the serial word to a binary level randomly and independently of the active video data bits wherein the next to the most significant bit is determined in response to an auxiliary data stream; and setting the most significant bit of the serial word to a binary level determined by a control bit selected from the group consisting of a DC Balance Control bit and a rogue character sequence removal (INV) bit.

2. The method according to claim 1 wherein the step of setting the most significant bit of the serial word to a binary level comprises the step of setting the most significant bit of the serial word to the binary level '1' whenever the binary level is determined by the INV bit, and further whenever any character generates a reserved synchronization character upon encoding.

3. The method according to claim 1 wherein the step of setting the most significant bit of the serial word to a binary level comprises the step of setting the most significant bit of the serial word to the binary level '0' whenever the binary level is determined by the INV bit, and further whenever any character generates a reserved synchronization character upon encoding.

4. The method according to claim 1 wherein the step of setting the most significant bit of the serial word to a binary level comprises the step of setting the most significant bit of the serial word to the binary level '1' whenever the binary level is determined by the INV bit, and further whenever a sequence of two adjacent synchronization characters appears in any position across a span of three consecutive stream characters.

5. The method according to claim 1 wherein the step of setting the most significant bit of the serial word to a binary level comprises the step of setting the most significant bit of the serial word to the binary level '0' whenever the binary level is determined by the INV bit, and further whenever a sequence of two adjacent synchronization characters appears in any position across a span of three consecutive stream characters.

6. The method according to claim 1 wherein the step of setting the most significant bit of the serial word to a binary level comprises the step of setting the most significant bit of the serial word to the binary level '1' whenever the binary level is determined by the INV bit, and further whenever a rogue character sequence occurs upon expanding the video data to a serial word, and wherein the binary level defined by the INV bit is a '0' otherwise.

7. The method according to claim 1 wherein the step of setting the most significant bit of the serial word to a binary level comprises the step of setting the most significant bit of the serial word to the binary level '0' whenever the binary level is determined by the INV bit, and further whenever a rogue character sequence occurs upon expanding the video data to a serial word, and wherein the binary level defined by the INV bit is a '1' otherwise.

8. The method according to claim 1 wherein the step of encoding a plurality of active video data bits to generate all of the bits other than the two most significant bits of a serial word comprises the steps of:

encoding a first bit of active video data and a bit selected from the group consisting of a DC Balance Control bit and a rogue character sequence removal (INV) bit, to generate a first bit of the serial word;

encoding a second bit of active video data, the first bit of the serial word, and at least one bit selected from the group consisting of an auxiliary stream data bit, the DC Balance Control bit and the INV bit, to generate a second bit of the serial word;

encoding a third bit of active video data, the second bit of the serial word, and at least one bit selected from the group consisting of the auxiliary stream data bit, the DC Balance Control bit and the INV bit, to generate a third bit of the serial word;

encoding a fourth bit of active video data, the third bit of the serial word, and at least one bit selected from the group consisting of the auxiliary stream data bit, the DC Balance Control bit and the INV bit, to generate a fourth bit of the serial word;

encoding a fifth bit of video data, the fourth bit of the serial word, and at least one bit selected from the group consisting of the auxiliary stream data bit, the DC Balance Control bit and the INV bit, to generate a fifth bit of the serial word;

encoding a sixth bit of video data, the fifth bit of the serial word, and at least one bit selected from the group consisting of the auxiliary stream data bit, the DC Balance Control bit and the INV bit, to generate a sixth bit of the serial word;

encoding a seventh bit of video data, the sixth bit of the serial word, and at least one bit selected from the group consisting of the auxiliary stream data bit, the DC Balance Control bit and the INV bit, to generate a seventh bit of the serial word; and encoding an eighth bit of video data, the seventh bit of the serial word, and at least one bit selected from the group consisting of the auxiliary stream data bit, the DC Balance Control bit and the INV bit, to generate an eighth bit of the serial word.

9. The method according to claim 1 wherein the step of setting the next to the most significant bit of the serial word to a binary level randomly and independently of the active video data bits wherein the next to the most significant bit is determined in response to an auxiliary data stream comprises the step of encoding an auxiliary stream data bit via performing an exclusive OR operation on the auxiliary stream data bit and the number '1' to generate the next to the most significant bit of the serial word.

10. The method according to claim 1 wherein the step of setting the next to the most significant bit of the serial word to a binary level randomly and independently of the active video data bits wherein the next to the most significant bit is determined in response to an auxiliary data stream comprises the step of encoding an auxiliary stream data bit to generate the next to the most significant bit of the serial word.

11. The method according to claim 1 wherein the step of encoding a plurality of active video data bits to generate all of the bits other than the two most significant bits of a serial word comprises the steps of:

encoding a first bit of active video data and a DC Balance Control bit to generate a first bit of the serial word;

encoding a second bit of active video data, the first bit of the serial word, an auxiliary stream data bit and the DC Balance Control bit to generate a second bit of the serial word;

encoding a third bit of active video data, the second bit of the serial word, the auxiliary stream data bit and the DC Balance Control bit to generate a third bit of the serial word;

encoding a fourth bit of active video data, the third bit of the serial word, the auxiliary stream data bit and the DC Balance Control bit to generate a fourth bit of the serial word;

encoding a fifth bit of active video data, the fourth bit of the serial word, the auxiliary stream data bit and the DC Balance Control bit to generate a fifth bit of the serial word;

encoding a sixth bit of active video data, the fifth bit of the serial word, the auxiliary stream data bit and the DC Balance Control bit to generate a sixth bit of the serial word;

encoding a seventh bit of active video data, the sixth bit of the serial word, the auxiliary stream data bit and the DC Balance Control bit to generate a seventh bit of the serial word; and encoding an eighth bit of active video data, the seventh bit of the serial word, the auxiliary stream data bit and the DC Balance Control bit to generate an eighth bit of the serial word.

12. The method according to claim 11 wherein each of the encoding steps comprise performing an exclusive OR operation on the encoded bits.

13. The method according to claim 1 wherein the step of encoding a plurality of active video data bits to generate all of the bits other than the two most significant bits of a serial word comprises the steps of:

encoding a first bit of active video data and a rogue character sequence removal (INV) bit to generate a first bit of the serial word;

encoding a second bit of active video data, the first bit of the serial word and the INV bit to generate a second bit of the serial word;

encoding a third bit of active video data, the second bit of the serial word and the INV bit to generate a third bit of the serial word;

encoding a fourth bit of active video data, the third bit of the serial word and the INV bit to generate a fourth bit of the serial word;

encoding a fifth bit of active video data, the fourth bit of the serial word and the INV bit to generate a fifth bit of the serial word;

encoding a sixth bit of active video data, the fifth bit of the serial word and the INV bit to generate a sixth bit of the serial word;

encoding a seventh bit of active video data, the sixth bit of the serial word and the INV bit to generate a seventh bit of the serial word; and encoding an eighth bit of active video data, the seventh bit of the serial word and the INV bit to generate an eighth bit of the serial word.

14. The method according to claim 13 wherein each of the encoding steps comprise performing an exclusive OR operation on the encoded bits.

* * * * *